United States Patent [19]

Nor

[11] Patent Number: 5,206,578
[45] Date of Patent: Apr. 27, 1993

[54] MONITORING SYSTEM FOR BATTERIES DURING CHARGE AND DISCHARGE

[75] Inventor: Jiri K. Nor, Oakville, Canada

[73] Assignee: Norvik Technologies Inc., Mississauga, Canada

[21] Appl. No.: 775,485

[22] Filed: Oct. 15, 1991

[51] Int. Cl.[5] ............................................. H02J 7/00
[52] U.S. Cl. ...................................... 320/14; 320/18; 320/21; 320/48
[58] Field of Search ...................... 320/14, 17, 18, 31, 320/43, 48, 21; 324/434

[56] References Cited

U.S. PATENT DOCUMENTS

| | | | |
|---|---|---|---|
| 3,593,100 | 7/1971 | Foster | 320/31 X |
| 3,786,343 | 1/1974 | Ehlers | 324/434 |
| 3,872,457 | 3/1975 | Ray et al. | 320/48 X |
| 4,053,824 | 10/1977 | Dupuis et al. | 324/434 |
| 4,118,661 | 10/1978 | Siekierski et al. | 320/48 X |
| 4,746,852 | 5/1988 | Martin | 320/31 X |
| 4,977,364 | 12/1990 | Kordesch et al. | 320/21 |

Primary Examiner—R. J. Hickey
Attorney, Agent, or Firm—Donald E. Hewson

[57] ABSTRACT

A monitoring circuit is provided to monitor batteries while they are being charged or discharged, where the batteries comprise a series of modules or cells that are connected in series. A terminal is placed between each adjacent pair of modules and at each end of the battery, so that voltage across each module may be measured at the pair of terminals that define the module. Several different determinations of module voltage may be made during charge and/or discharge of the battery including the resistance free voltage of the module, and the module voltage while current is flowing through the battery. Generally, some or all of the modules are tested periodically, where the interruption interval for internal resistance free voltage determination may be in the order of 2 to 3 ms, and the testing frequency for the battery may be in the order of 0.5 to 25 Hz. Alarms may be triggered in the event of module voltages being sensed that are outside of predetermined limits, meaning that the charging and/or discharging characteristics of any of the modules has changed and is significantly different than those of the other modules. By such alarm indications, the module may be changed before serious damage occurs to the battery, either by overcharging or severely discharging the battery.

11 Claims, 5 Drawing Sheets

MONITORING SYSTEM FOR BATTERIES DURING CHARGE AND DISCHARGE

FIELD OF THE INVENTION

This invention relates to monitoring systems or circuits for batteries, whereby the operation of the battery may be monitored during charge or discharge. The monitoring of batteries during charge or discharge determines whether any module or cell of the battery has become faulty, and is especially important in respect of large batteries that may have very high voltage and/or current and/or ampere-hour ratings. The monitoring system of the present invention is applicable to batteries which comprise a series of cells or, in the usual case, modules, which are configured in such a manner that the voltage across any one module can be determined at any time under the conditions described hereafter.

BACKGROUND OF THE INVENTION

There are many circumstances where large batteries may be found. In particular, large batteries or battery installations can be found both in stationary applications or for traction purposes, such as in standby DC power installations from which invertors and the like may be run; or in traction devices such as fork lift trucks and pallet trucks, golf carts, and electrically powered passenger and cargo vehicles. Large batteries may be configured from a plurality of cells or modules, which may be connected in series so as to develop a substantial terminal voltage across the battery, and there may often be a parallel connection of other modules or a series configuration of parallel connected cells or modules.

The present invention is particularly directed to large batteries which are configured in a series configuration of individual cells or modules. It is the purpose of the present invention to provide means for monitoring the condition and performance of the thus configured batteries, and particularly when such batteries may be utilized in electric vehicles. Typical battery configurations of experimental electric vehicles currently found in the public include the General Motors IMPACT, which utilizes a battery having a battery voltage of 320 V, and on the other hand a 72 V battery which is found in the PANDA ELETTRA manufactured by Fiat.

The present inventor is also the inventor in U.S. patent applications Ser. Nos. 07/253,703 and 07/676,523 filed Oct. 6, 1988 and May 2, 1991, respectively, each in respect of battery chargers which are capable of providing very high rates of charge to batteries. The charged batteries may, in some instances, have very high capacities. Each of those applications is assigned to the common assignee herewith. A further co-pending application in the name of the present invention, and with a common assignee, is directed towards charging stations at which electric vehicles may have their batteries recharged in a very short period of time. Of course, it is important that the batteries be monitored not only while they are being charged, but during discharge as they are in operation, because of the high current flow to which the battery may be subjected. This is particularly evident when it is noted that a standard of only a few years prior to the filing of the present application was generally that batteries would be charged at a rate of about 0.1 C—in other words, at a current which required 10 hours to recharge the battery; whereas it is now feasible to charge very high capacity batteries at rates of 3 C to 10 C—in other words, in as little as from 6 minutes to 20 or 30 minutes. Clearly the risk of overcharge of batteries being charged at such rates is higher, and thus the risk of damage to the cells or modules of the battery is higher. Likewise, batteries that are used in traction circumstances, in particular, may be required to be discharged at very high rates of current, possible over sustained periods of time.

In a series connected battery, the same current passes through all of the cells in the battery, or all of the battery modules in a large, high voltage battery, both while the battery is being charged and when it is being discharged. There are electrical means available by which weak cells or modules of the battery may be bypassed, but those means are cumbersome and costly, and generally result in a lower operating terminal voltage of the battery; and they are therefore impractical. Thus, the present invention addresses battery configurations where all of the cells or modules of the series configured battery are active at all times.

Several significant advantages are provided by the present invention, which are to the benefit of series connected batteries. They include the ability to provide for adjustment of the charging current or the discharge current in keeping with the ability of the weakest battery module or cell to pass the adjusted current, thereby preventing abuse and prospective irreversible damage to the module or cell. Likewise, the present invention provides means by which it is capable to diagnose and identify a weakening battery module or cell, long before failure of the module or cell occurs. By such early detection and identification of a weak battery module or cell, the defective battery module may be replaced at the earliest opportunity, thereby restoring the battery to its full useful and operative capacity.

These features of the present invention are achieved by monitoring the cell electrochemical potential—in other words, the resistance free voltage of the cell or module—as well as in some circumstances monitoring the cell or module resistive drop—i.e., the voltage drop across the module or cell which may be attributed to and is a consequence of the ohmic resistance of that module or cell. Such monitoring is not only possible, but in keeping with provisions of the present invention, it is conducted during all conditions of the battery operation; in other words, during both charge and discharge of the battery. It will be noted in the following discussion that there may be more circumstances where the battery operation and condition is monitored during charge rather than being monitored during discharge, arising at least in part because the battery is usually in a fixed place while it is being charged. Moreover, the charging operation may be under the control of a charger which is fixed or stationary, and therefore capable of monitoring a plurality of batteries as they may be individually connected to the charger. This charge monitoring is, however, of significant value and is fully contemplated by the present invention.

The present invention recognizes that the resistance free voltage of a battery or of a cell or module within the battery is the key characteristic by which a determination may be made as to the state of charge of the module or cell, and indeed as to its overall condition and its ability to undergo electrochemical activity—charging or discharging. Moreover, as noted in the co-pending applications directed to battery charging, the high limit and relative value of the internal resistance free voltage of a battery module or cell is utilized to control the charging process for that battery.

It is stressed that the present invention recognizes that, particularly in installations such as an electric vehicle, the low limit of the resistance free voltage of a battery cell or module should be monitored during discharge so as to permit control of the discharge current in order that it may be gradually reduced while a warning is given to the vehicle operator, and eventually so as to terminate the discharge operation by inhibiting the traction controller and other loads on the battery, at a predetermined threshold. The analogy is that the first condition noted above is similar to that of a "low fuel" indicator in an ordinary petroleum fueled vehicle whereas the second condition is analogous to a fuel tank "empty" condition. Abuse and damage to the battery is thereby precluded.

Upon analysis, it is obvious that close monitoring of the charge and discharge conditions of a battery are superior to simply monitoring the battery voltage, since it permits the battery to more closely approach its fully discharged condition without running into the prospective danger of overdischarge. This is especially so if, in keeping with the present invention, the condition or state of the weakest cell or module of the battery is that which is used to determine the instant at which either a warning of impending module or cell failure should be given, or battery discharge operation is terminated.

Moreover, the present invention also recognizes that resistive drop across the battery cell or module while current is passing through it on either charge or discharge, provides a direct indication of the amount of irreversible resistive heat which is evolved in that cell or module as a consequence of the current flow. Upon analysis, it is clear that an increasing resistive voltage drop across the cell or module is an indication of an increasing cell or module resistance. That increased cell or module resistance may be caused such as by deterioration of the electrodes in the cell or module, or by poor internal or external contact of any current carrying component, or even as a consequence of loss of electrolyte in the cell or module.

The thesis that parallel connection of batteries is not recommended for fast charging of the batteries, is presented herein. Current sharing among parallel chains within a battery is an unstable equilibrium; and without some further additional electrical means to force equal current sharing within a parallel connection—which additional means is cumbersome and expensive, causing additional energy losses, and unnecessary—the parallel connection of a battery while being charged is discouraged. The reasons are explained below:

It must be kept in mind that the cell voltage of most known practical battery systems exhibits a negative temperature coefficient during charging. Moreover, even with the most stringent manufacturing controls, there are minor differences among otherwise equal cells in a battery, or among equal battery modules in a large scale battery. Any battery cell which becomes marginally warmer in a parallel connection, under charge conditions, will exhibit a lower electrochemical potential because of the negative temperature coefficient, therefore that cell presents a lower electrochemical resistance to the charge current. Thus, the non-conforming cell presents a preferential path to the charging current; and as a consequence of that circumstance, even further increased current will flow to the cell and it will become yet again warmer. That encourages still higher charge current than through any other cell parallel to it, and the effect continues to spiral. Thus, one battery cell or module will become hot and overcharged, while the remaining battery cells or modules in parallel to it remain cold and undercharged. The only possible manner by which that problem can be overcome is to provide good thermal coupling, with a time constant that is substantially shorter than the charge time—for example, among the electrodes in a multiple plate cell. In that case, then the heat is transferred fast between the non-conforming unit and its surrounding and parallel neighbours, so that all of the parallel cell elements remain at substantially the same temperature. Such conditions are clearly not practical in the context of large scale, high voltage batteries.

On the other hand, when a battery is being discharged, it is recognized that a stable equilibrium may be presented in current sharing circumstances among parallel cells or modules. Those features are, however, outside the scope of the present invention.

What the present invention does provide is a monitoring circuit for a battery, whether the battery is being charged or discharged, where the battery comprises a series of modules that are connected in series with terminals placed between each adjacent pair of modules and at each end of the battery, so that the voltage across each module may be measured. In one aspect of the present invention, means are provided for periodically interrupting the flow of current to or from the battery for an interruption interval of fewer than about 2 to 5 ms, or up to 10 ms for installations such as large traction batteries; and means are also provided for selectively sampling any one of the modules during an interruption of current flow, so as to make a determination of the resistance free voltage of that module. A selected plurality, if not all of the modules, could under some circumstances be individually sampled during any one interruption of the current flow. In any event, means are provided for comparing the resistance free voltage of any module that is sampled against at least two reference voltages, so as to determine if the resistance free voltage is above a first predetermined level or below a second predetermined level. The present invention further provides means for causing an alarm indication in the event that the resistance free voltage is found to be either above the first predetermined level or below the second predetermined level.

In a further embodiment of the present invention, further means are provided for sampling the voltage across any one of the modules at a time while current is flowing through the module. That sampling may occur during charge or discharge. Sample and hold means are provided for determining and temporarily holding the values of a first voltage across the module being sampled when current is flowing through the module, and also to sample and hold the value of a second resistance free voltage across that same module during an interruption interval of current through the module. Means are provided for determining the relative magnitudes of the first and second voltages to each other, and for determining the higher of the first and second voltages during charging and discharging operations of the battery. This is accomplished by determining the absolute value of the differences between those two voltages during charge and discharge conditions; noting that under charge conditions the first voltage should have an absolute value higher than the second voltage, and that under discharge conditions the circumstances would be reversed. Further alarm means are provided to give an alarm indication in the event that either of the first or second voltages is above or below predetermined values, or in the event that the relative magnitudes of the first and second voltages to each other are beyond predetermined limits.

BRIEF DESCRIPTION OF THE DRAWINGS

The present invention is described in greater detail hereafter, in association with the accompanying drawings, in which.

DESCRIPTION OF THE PREFERRED EMBODIMENTS

Figure 1:
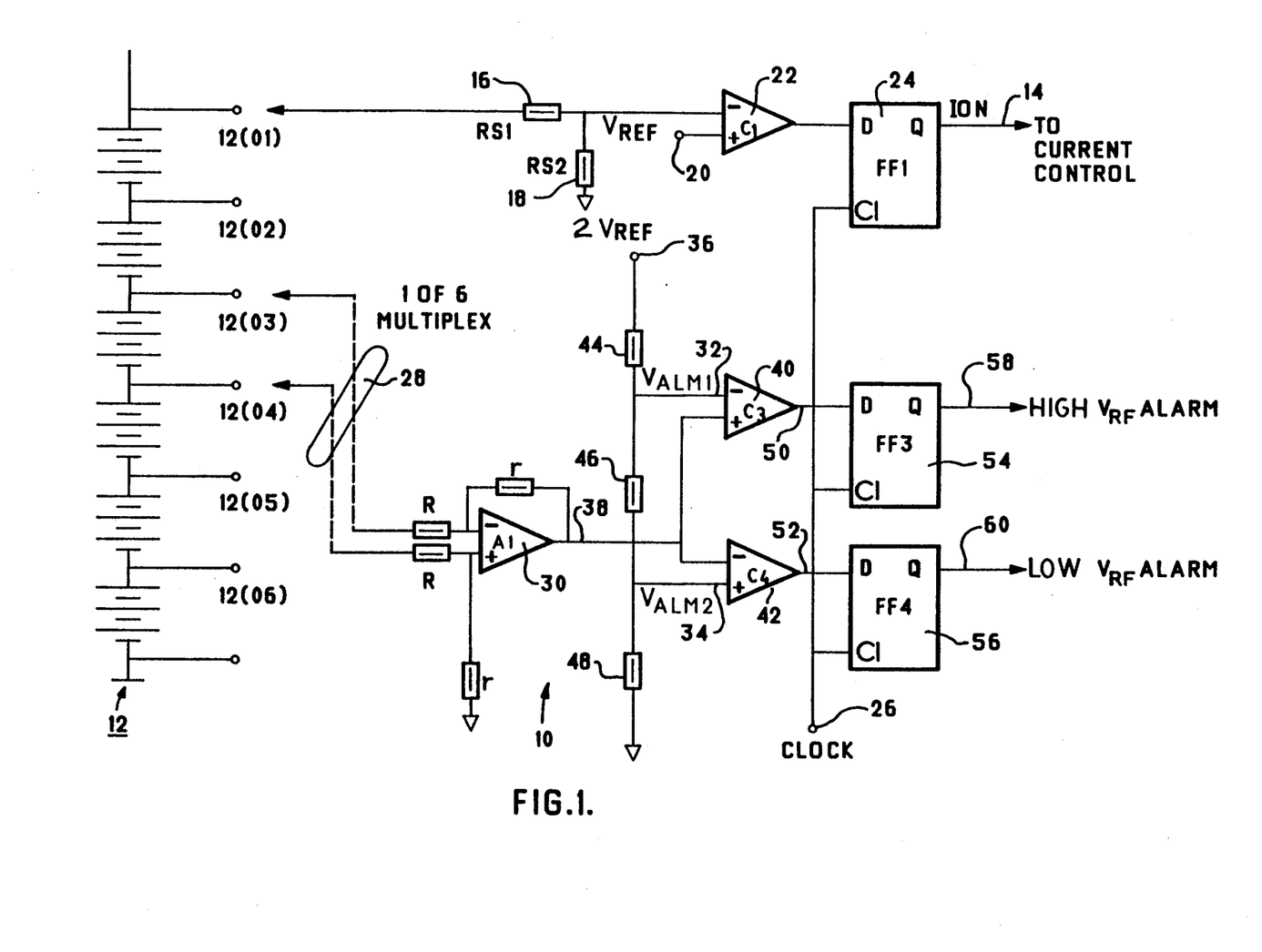
FIG. 1 is a simple schematic for monitoring a series connected battery during a charging operation.

Turning first to FIG. 1, a monitoring circuit 10 is shown, for monitoring a series connected battery 12 while it is being charged.

Co-pending application Ser. No. 07/253,703 and 07/676,523, noted above, explain in detail the operation of charging circuits where current control is derived from the resistance free voltage of the battery being charged. For purposes of the present discussion, it is necessary merely to note that a current control output on line 14 is derived from a resistance free voltage taken from the whole battery at voltage divider 16, 18, where the voltage thereby derived is compared by comparator 22 to an internally generated reference voltage presented at 20. The current control signal on line 14 is strobed by flip flop 24, under the control of a clock pulse presented at 26. In effect, the current control for the charger comes as a consequence of the average resistance free battery voltage across the entire battery 12.

However, each of the modules 12(01), 12(02), . . . 12(06) is scanned in keeping with the present invention to determine the resistance free voltage of any one of those modules individually, and thereby to detect and flag any module which is abnormally low or abnormally high as to its resistance free potential, in the following manner:

A time division multiplexer is indicated at 28, whereby any one of the modules 12(01) to 12(06) may be sampled at a time, with the sample being applied across the inputs of a differential amplifier 30. Individual amplifiers, one across each battery module, may of course be used. Two reference voltages 32 and 34 are derived as a function of the reference voltage at point 20, from point 36, and those two reference voltages at 32 and 34 are compared to the output of differential amplifier 30 at 38, by comparators 40 and 42, respectively. The values of the resistors in the string 44, 46, 48, are chosen so that the reference voltages at 32 and 34, and the outputs of the comparators 40 and 42 at 50 and 52, respectively, may be utilized to flag low or high resistance free voltages. In other words, output 50 from comparator 40 is applied to flip flop 54; if the output 50 is high at the time of the positive transition of the strobe or clock pulse present at 26, it will activate an output on line 58 which will cause a high alarm. Likewise, if there is an output 52 from the comparator 42, it will appear at line 60 through flip flop 56 strobed by the clock pulse signal at 26, to cause a low resistance free voltage alarm.

Figure 6:
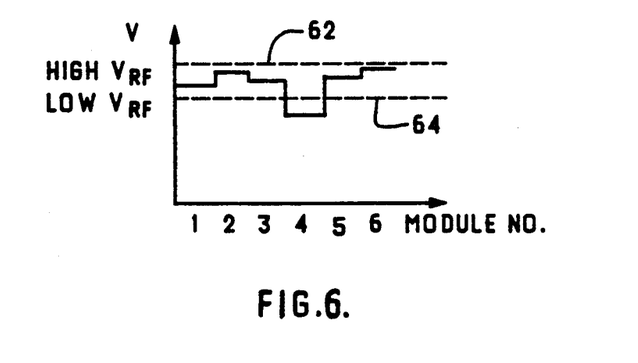
FIG. 6 is a representative time division multiplex scan showing the variations of sensed resistance free voltages of the modules or cells of a battery.

A typical time division multiplex scan of the resistance free voltage of individual modules is shown in FIG. 6. The resistance free voltage of the selected module is present at the output 38 of amplifier 30 for a short instant of time when flip flops 54 and 56 are strobed by the clock signal at 26. The resistance free voltage of each of the modules is shown in FIG. 6 with reference to the voltage reference lines 62 and 64, which indicate the bounds of acceptably high module resistance free potential and acceptably low module resistance free potential, respectively. It will be noted that the output from module number 12(04), as shown in FIG. 6, is unacceptably low.

The low resistance free voltage of any module will reveal that the module contains a cell (or cells) which lacks the capability to hold charge due to its poor electrochemical activity; in other words, the module is either dead or dying. Prematurely high resistance free voltage of a module during charging, on the other hand, indicates a module which contains a cell (or cells) having a lower and presumably declining capacity to accept charge. That module will heat up more, it will lose more water from its electrolyte (assuming an aqueous electrolyte), and it otherwise becomes a weak link in the battery 12. The circuit of FIG. 1, therefore, provides a diagnostic means whereby the weak link is identified, and therefore an early warning of impending trouble is given.

It is clear that the edge triggered flip flops 54 and 56 shown in FIG. 1 could be substituted by other circuitry, such as sample and hold circuits as identified in co-pending patent application Ser. No. 07/523,703, noted above.

Figure 2:
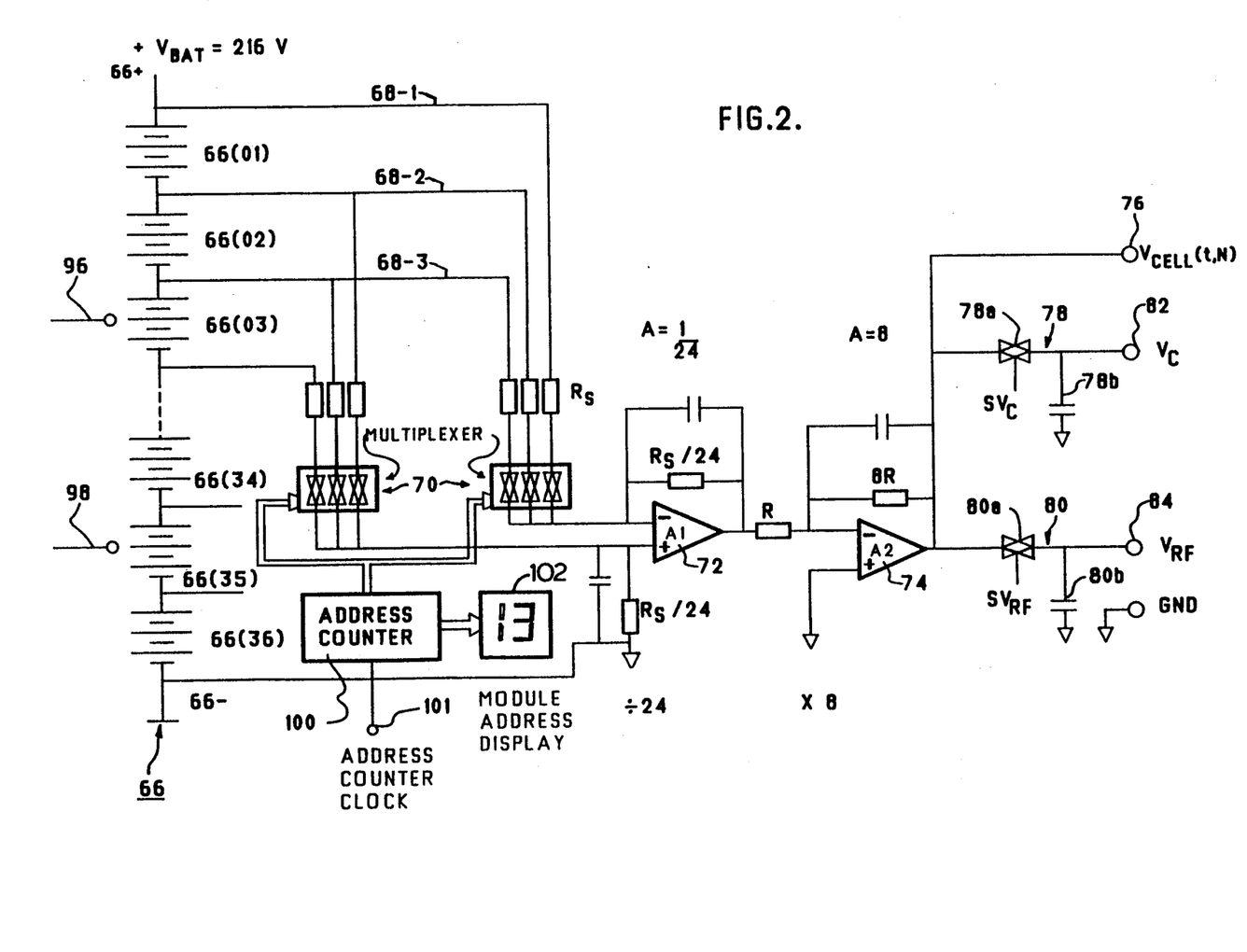
FIG. 2 provides a representative multiplexed sampling circuit that may be used for high voltage batteries.

Moreover, it should be noted that the time division multiplex scan of FIG. 6 may be representative of an output of a sample and hold amplifier which samples the resistance free module voltages as found at 84 of FIG. 2, discussed hereafter; as well as the instantaneous output 38 of FIG. 1, as discussed above.

A typical utilization of a circuit in keeping with that of FIG. 1 is its adaptation to a monitoring circuit for a charger for a golf cart or an industrial fork lift truck and the like, having a 36 V lead acid battery which comprises six 6-volt modules.

FIG. 2 provides a sampling and multiplexing circuit that is particularly useful in circumstances where a high voltage battery is to be monitored, during both charge and discharge conditions. The battery 66, in the example chosen, is a 216 V battery, being comprised of 36 6-volt modules. They are indicated in FIG. 2. In this case, sensing wires are brought from the battery terminals 66+ and 66−, and from each of the intermodular nodes, as noted at wires 68−1, 68−2, etc. A solid state multiplexer 70 is provided, which may conveniently be one having internal clamping diodes and an input common mode range of 0 to 15 volts. Operational amplifiers 72 and 74 are provided, and they translate the individual module voltages into a normalized single module voltage (or single cell voltage) $v_{cell}$. That normalized single cell voltage is referenced to the negative battery terminal, in a time division multiplex. It is shown at terminal 76 as $v_{cell}(t,N)$.

Two sample and hold circuits 78 and 80 are provided, from which two further values are presented at terminals 82 and 84 as $V_C$ and $V_{RF}$, respectively. The sample and hold circuits may conveniently comprise CMOS bilateral switches 78a and 80a, and holding capacitors 78b and 80b, as shown. The value $V_C$ is the value of a cell or module voltage when the current is on—that is, current is flowing through the battery—and the value $V_{RF}$ is the resistance free voltage that is sensed for that same module or cell at a time that the current flow through the battery has been interrupted. In keeping with the teachings of the co-pending applications noted above, $V_{RF}$ may be the resistance free voltage of any one of the modules as discussed hereafter during a time that the charging current to the battery has been interrupted under the control of the charger. As noted hereafter, $V_{RF}$ may also be the resistance free voltage of a module where the current through the module has been temporarily interrupted while the battery is under discharge conditions.

Figure 5:
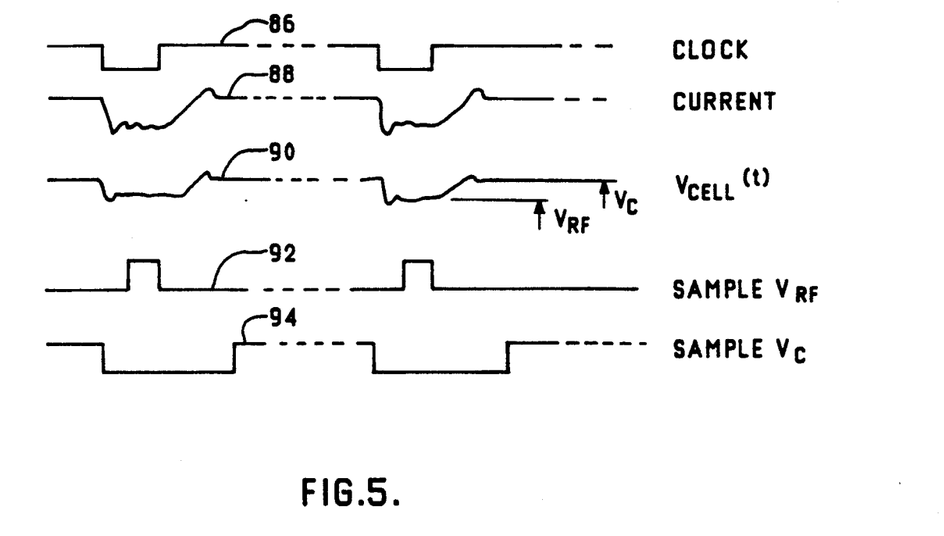
FIG. 5 is a family of curves showing current and voltage conditions under various circumstances as determined by operation of the circuit of FIG. 2.

Reference is made to FIG. 5, for a discussion of representative wave forms that may be found during operation of the circuit of FIG. 2. Thus, a clock wave form is shown at curve 86. It may turn the charging current ON and OFF in typical duty cycles having duty ratios in the range of 10:1 to 30:1. The sample $V_C$ and sample $V_{RF}$ signals are derived as "delayed ON" and "delayed OFF" signals from the clock, so as to effect sampling of the $V_C$ and $V_{RF}$ values during their stable period—after transients have died out as shown in curves 88 and 90. Thus, curve 92 shows sampling of curve 90 in a reasonably stable period with the charging current off; and likewise curve 94 shows sampling of curve 90 in a stable period when charging current is flowing through the battery 66.

It should be noted that, during charge conditions, the voltage $V_C$ is greater than the $V_{RF}$ value; however, during discharge conditions, the value of $V_C$ is less than the $V_{RF}$. Thus, the two conditions noted below should apply, and conditions other than those noted are abnormal:

$V_C > V_{RF}$ (during charge)  Condition 1

$V_C > V_{RF}$ (during discharge)  Condition 2

It will also be noted that a pair of terminals 96 and 98 are located within the battery 66. Those terminals are strategically located and are associated with temperature sensors located within or applied to the battery 66, by which the temperature condition of the battery may be continuously determined in a manner as discussed below.

There is also an address counter 100 with which is associated a suitable display means 102. The address counter 100 and the module address display 102 work together so that the identity of each module that is being sampled at any instant in time is displayed. The operation of the multiplexer 70 is such that it has a scanning rate of 1 or 2 Hz, which thereby allows the battery 66 having 36 modules to be scanned entirely in about 18 to 36 seconds. That scanning rate is sufficient that an observer may easily read the output on the module address display 102, so that if an alarm situation occurs the identity of the non-conforming module may be easily learned without the necessity for other associated circuitry. Of course, a higher scanning rate, in the order of about 10 Hz, will provide for a complete scan of the battery in 3.6 seconds; but in that case, the visual presentation on the module address display 102 might have to be slowed down such as by latching the address counter value of the offending module in a latch inserted between the counter 100 and the display 102.

The address counter 100 may be driven from its own clock, having an input at 101. The address counter clock may be asynchronous with respect to the internal clock within the battery charging circuits, having an input at line 118 as noted below. More generally, however, the clock inputs at 101 and 118 are synchronous. Thus, the clock input to the address counter 100 and 101 may conveniently be a binary fraction of the clock input at line 118, for example ½, ¼, ⅛ or 1/16. That means that the address counter 100 and time division multiplexer 70 will dwell on any single module 66(01), 66(02), 66(n) etc., for 2, 4, 8 or 16 charging interruptions under the control of the internal clock. Moreover, the address counter clock at 101 may run at the same speed as the internal clock, for example at 10 Hz; but that puts extra demands on the sample and hold circuits 78 and 80, since they must acquire and stabilize the correct values of $V_C$ and $V_{RF}$ rather quickly.

Figure 3:
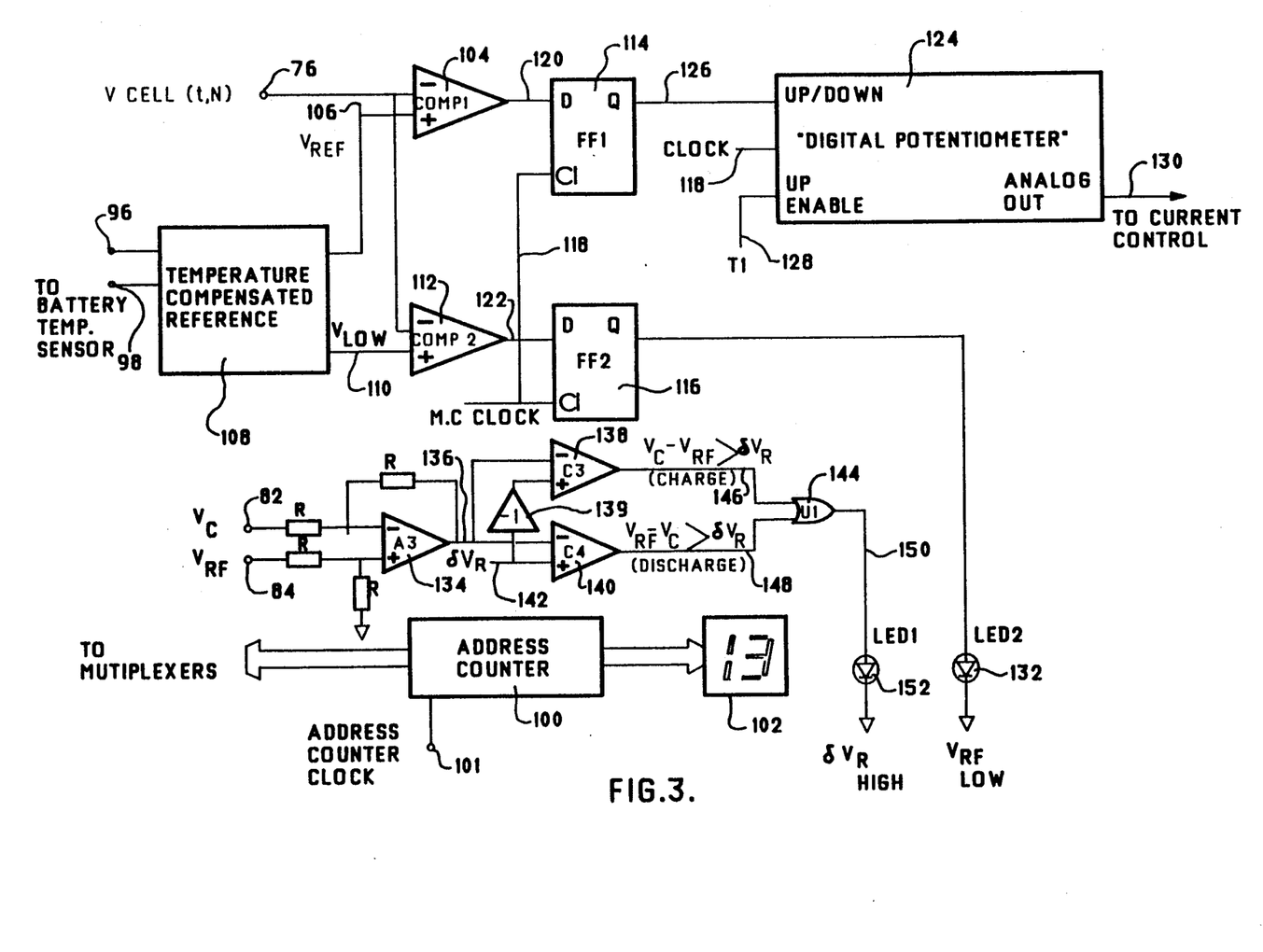
FIG. 3 is a complementary circuit that co-operates with the circuit of FIG. 2 to control battery charging currents in the initial stages of charging, and to provide sampling and alarm status indications during both charge and discharge of the battery shown in the circuit of FIG. 2.

It will be noted that terminals 76, 82, 84, 96 and 98 are found in each of FIGS. 2 and 3. The circuit of FIG. 3 includes charging current control circuitry, and analysis circuitry, by which the operation and control of the battery 66 may be effected at least as to its charging operation, and by which the battery is monitored at all times during both charge and discharge operations.

The time dependent wave form $v_{cell}(t,N)$ appears at terminal 76, and in keeping with the teachings of the previous co-pending applications noted above with respect to battery charging circuits, it is applied at an input of comparator 104. The other input of comparator 104 is a voltage reference input at 106, and it comes as a consequence of temperature compensation circuitry 108 in keeping with the teachings of application Ser. No. 07/676,523 noted above. The temperature compensation circuitry 108 also issues a further output at 110, which is an input to comparator 112 together with the same input from terminal 76. A pair of flip flops 114 and 116 are each controlled by a clock signal from line 118, where the clock signal is from an internal clock within the battery charging circuits, and is adapted to strobe the operation of flip flops 114 and 116. The output of comparator 104 appears at 120, and is an input to flip flop 114; likewise, the output from comparator 112 at 122 is an input to flip flop 116.

The clock line 118 also appears as an input to a digital potentiometer 124, whose inputs include the output of flip flop 114 at line 126, and a time-out input signifying the expiration of a predetermined period of time $T_1$ (as discussed hereafter) at line 128. The output of the digital potentiometer is an analog signal which appears on line 130, and which is used to control the charging current delivered to the battery 66.

In the usual manner, and in the absence of an alarm condition which may occur as a consequence of the temperature of the battery 66 being beyond predetermined limits, the control circuit comprising comparator 104, flip flop 114, and digital potentiometer 124 is operative during charging conditions. When a charging sequence is first initiated, a predetermined period of time $T_1$ is started, and the digital potentiometer 124 is permitted to adjust its output at 130 both upwards and downwards as a consequence of the input to it at line 126. Thus, if the battery 66 is substantially fully discharged, most if not all of the modules 66(01) to 66(36) will request an up motion of the digital potentiometer by the value determined at terminal 76 and reflected at line 126, thereby forcing the digital potentiometer 124 to take its output at 130 upwards. The operation of the digital potentiometer 124 is essentially that of an averaging potentiometer, having taken an integration of the time dependent module voltages presented at terminal 76 during a scanning sequence by the multiplexer 70. On the other hand, if the battery 76 is substantially fully charged, the same averaging function of the digital potentiometer 124 will find a position which is such that the analog output at line 130 is below its maximum value, being essentially that position where the number of modules requesting an "up" operation by the digital potentiometer 124 is equal to the number of modules which requests a "down" operation. These sequences, and the adjustment of the analog output at line 130, will continue for the predetermined time period $T_1$, which is typically one minute.

When the time-out signal appears at line 128 at the end of time period $T_1$, the digital potentiometer 124 is then configured so that it can only move downwardly as to its analog output at line 130. A one way controller as discussed in co-pending application Ser. No. 07/676,523, noted above, then becomes effective. Thus, the analog current control output on line 130 will continue to move "down", and adjustments will continue to the charging current; and it is clear that the downward adjustments will be made according to the time dependent waveform $V_{cell}(t,N)$ whenever the $V_{RF}$ of any module reaches the reference voltage value, which is indicative of that module (or cell) of the battery 66 which has the least or lowest charge acceptance capability. Thus, charging of the battery 66 will occur only at a rate at which the weakest or worst module or cell of the battery can accept charge, so as not to abuse that module.

Of course, because of the operation of the analog counter 100 and the module address display 102, the identity of the module which is requesting the downward operation of the digital potentiometer 124 can be easily determined.

The operation of comparator 112 and flip flop 116 is such that if a module in battery 66 has been so severely overdischarged or has failed, to the extent that a reference voltage for that module or cell is below a predetermined limit, an immediate signal will occur such as at the LED 132 in coincidence with the identity of that failed module or cell, which will appear at the display 102.

When the battery 66 is being discharged, the output of the circuit comprising the temperature compensating circuitry 108, comparator 112, and flip flop 116, can be used to indicate a circumstance within the battery 66 which is analogous to a "LOW FUEL" circumstance in an ordinary automobile. In that case, the discharge current permitted to flow through the battery 66 may be limited to a progressively lower value. Ultimately, a situation may occur when the weakest module or cell in the battery 66 is not able to sustain a circumstance where its resistance free voltage at a predetermined value of discharge current is not higher than a predetermined cut off voltage, and at that point the analogy continues such that the battery 66 is essentially "EMPTY", and further discharge of the battery 66 is inhibited.

It will be noted that terminals 82 and 84 which, respectively, carry a signal indicative of the value of a module or cell voltage through any specific module when current is flowing through the battery 66 as determined at the sample and hold circuit 78, and the resistance free value of the module or cell when the current is not flowing through the battery 66 as determined at sample and hold circuit 80, are the two inputs to amplifier 134. Its output appears at line 136, and is one of the two inputs to each of comparators 138 and 140. The other input to comparators 138 and 140 comes from line 142, and is defined as the predetermined value of the resistive voltage drop, $\delta V_R$. The input to comparator 138, however, is inverted through an inverting amplifier 139, so as to be of the opposite sense to the $\delta V_R$ input to comparator 140. The defined value $\delta V$ is the resistive drop through the module being sampled at any time while current is flowing—in other words, the voltage across the module which is the product of the current through the module and its internal resistance.

An OR gate 144 is adapted to take the outputs from each of comparators 138 and 140 on lines 146 and 148, respectively.

It will be noted that comparators 138 and 140 have their inputs from lines 136 and 142 reversed with respect to each other. Moreover, as noted above, the $\delta V_R$ input to comparator 138 is inverted to the sense of the same input to comparator 140. Thus, the output of comparator 138 occurs during a charging operation when the module voltage $V_C$ at terminal 82 is greater than the resistance free voltage $V_{RF}$ at terminal 84, and its differences is greater than $\delta V_R$. Likewise, the output at line 148 from comparator 140 occurs when the difference between $V_{RF}$ and $V_C$ is greater than $\delta V_R$ at any time while the battery 66 is being discharged.

It follows that the output from the OR gate 144 at line 150 will illuminate the LED 152 when the absolute value of the difference between $V_C$ and $V_{RF}$ is greater than $\delta V_R$, which is expressed as follows:

$$|V_c - V_{RF}| > \delta V_R \qquad \text{Condition 3}$$

It will also be noted that the lamp 152 will remain illuminated in coincidence with the module address display 102, whereby the identity of the module will be noted. From this, it can be determined that a specific module or cell has a high resistive drop across it as current flows through it, and therefore that it has a high resistance.

Obviously, it is most important to monitor the condition of LED 152 during any period when current through the battery 66 is at its maximum, because at that time the resistive drop $\delta V$ and the dissipated resistance heat from any high resistance module will be at their highest level, as follows where $Q_{module}$ is the dissipated resistive heat:

$$\delta V = |V_c - V_{RF}| = R_{module} \times I$$

$$Q_{module} = \delta V \times I = R_{module} \times I^2$$

It should also be noted that connecting leads or bridges between the battery cells or modules may also contribute some resistance due to their own wire resistance as well as any contact resistance $R_C$, so that the module resistance $R_{module}$ will be the sum of the internal resistance $R_{int}$ of the module plus $R_C$.

Therefore, monitoring the condition of LED 152 and the address of any module indicated on the module address display 102 will not only indicate a faulty module or cell, it will also indicate the existence of a faulty intermodular connection or contact, such as a loose or corroded contact. Indeed, experimental testing of circuits according to the present invention, more specifically in keeping with the circuit of FIG. 1, resulted in a damaged battery terminal which came as a consequence of a loose contact. If the monitoring circuits of FIGS. 2 and 3 had been in operation, that loose contact would have been immediately noted and diagnosed, before any notable damage could have occurred.

Figure 4:
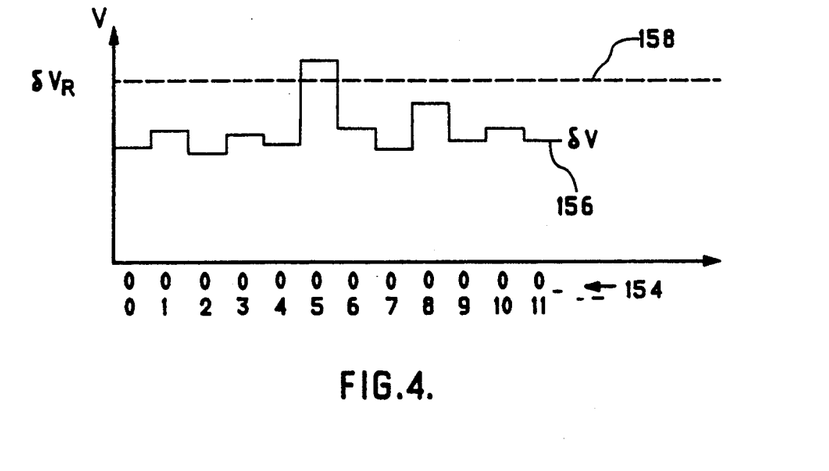
FIG. 4 is a representative time division multiplex scan, showing the output of a differential amplifier in FIG. 3.

FIG. 4 illustrates a typical time division multiplex scan of the output of differential amplifier 134 at line 136. In this Figure, the identity of each module is noted as indicated at 154, and the scanning curve 156 is compared against a predetermined $\delta V_R$ value shown at 158. It will be noted that $\delta V$ for module 66(05) exceeds the predetermined value, and thus an alarm condition will occur such that LED 152 will be illuminated in coincidence with the address (05) being displayed at the module address display 102. The $\delta V$ value for module 66(08) is also higher than average, but remains below the alarm threshold so that an alarm condition would not occur as a consequence of the $\delta V$ value for that module 66(08).

Figure 7:
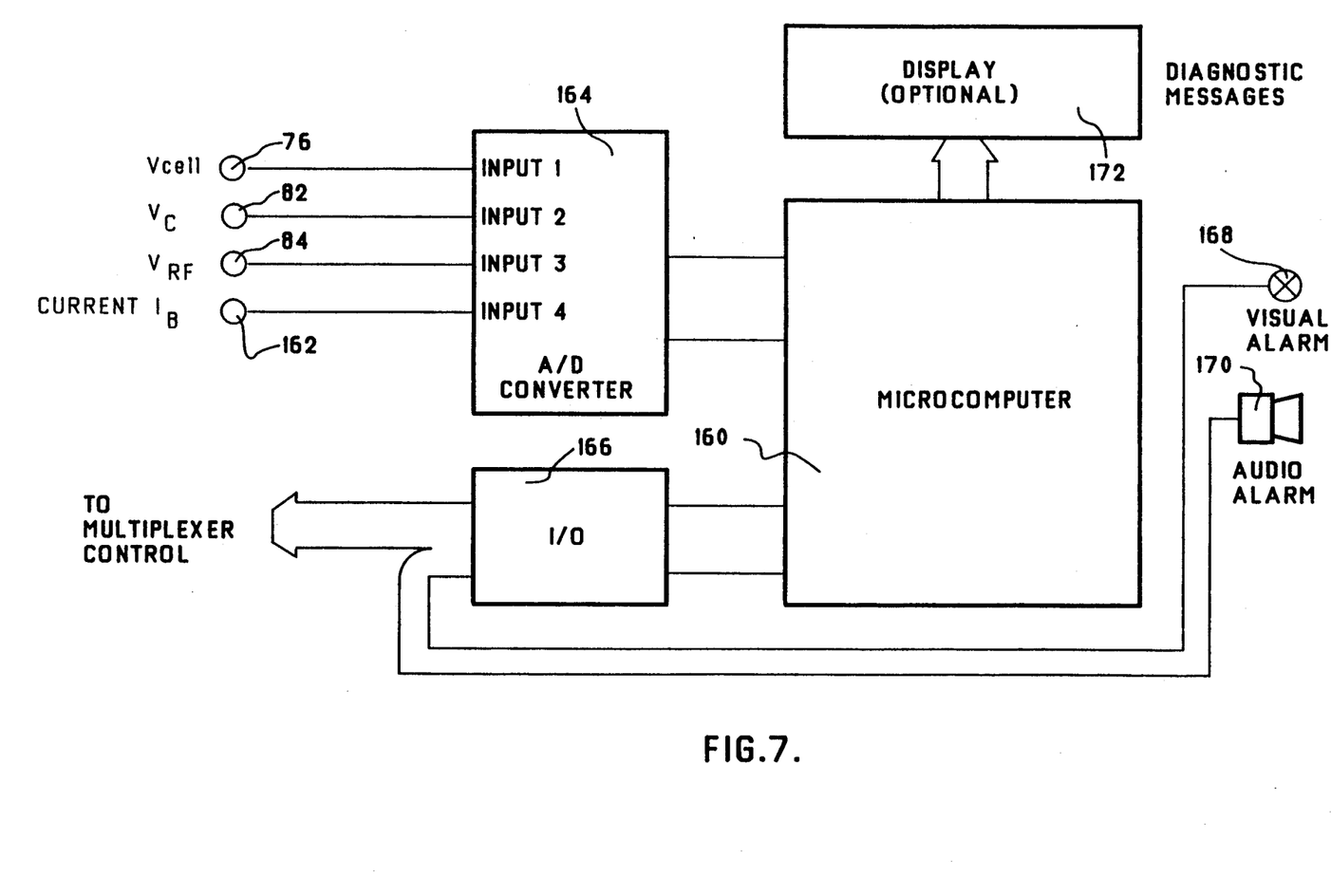
FIG. 7 proposes the use of a microcomputer to control scanning and diagnostic functions in keeping with the present invention.

Turning to FIG. 7, a scheme is shown to incorporate a simple and inexpensive single chip microcomputer 160 with the time division multiplex scanning as shown in FIG. 2. Thus, terminals 76, 82, and 84 are found in FIG. 7, carrying the same values as in each of FIGS. 2 and 3, and a further terminal 162 is also found on which appears a signal indicative of the value of the current $I_B$ flowing through the battery 66. Each of those inputs is to an analog-to-digital converter 164, which interacts with the microcomputer 160. An input/output interface 166 is interposed between the microcomputer 160 and the multiplexer 70; and it also provides means for sending alarm signals from the microcomputer 160 to such devices as a visual alarm 168 and an audio alarm 170. A display 172 may optionally also be associated with the microcomputer 160, to display the address of any module being sampled in the same manner as the module address display 102 in FIGS. 2 and 3. The display 172 may optionally be arranged to display other diagnostic data or messages concerning the status of the battery, such as its temperature, its state of charge, and the like.

Obviously, by use of the microcomputer 160, very sophisticated monitoring can be undertaken, from which sophisticated information processing and evaluation as to the performance and diagnostics concerning the condition of the battery 66 may be made. A scanning speed for the multiplexer 70 can be increased, for example to 10 Hz, whereby the 36 module battery 66 can be scanned in 3.6 seconds. Moreover, computations may be performed whereby each of the module or cell resistances is monitored at all times. As well, mean values and mean deviations of key parameters such as the values of $V_C$ at terminal 82 and $V_{RF}$ at terminal 84 with respect to the battery current $I_B$ at terminal 162, will derive an instantaneous value for the module resistance as a function of the absolute value of $V_C$ minus the absolute value of $V_{RF}$ divided by the absolute value of the battery current $I_B$, as follows:

$$R_{module} = \left| \frac{V_c - V_{RF}}{I_B} \right|$$

Still further, it is possible to improve heat management of the heat dissipated within the battery 66, because the resistive heat dissipated comes as a consequence of the instantaneous value of the battery current, as follows:

$$Q_{module} = R_{module} \times I_B^2$$

That means that the resistive heat dissipated in each individual battery module or cell can be individually monitored, which provides an improvement over the use of temperature sensors having outputs only at terminals 96 and 98 as indicated in FIG. 2.

Still further, monitoring the resistance free voltage of individual modules provides yet a further refined means whereby the state of charge of the battery can be determined. In other words, and to conclude the analogy to an ordinary automobile, a better "fuel gauge" is provided by the use of circuits such as that indicated in FIG. 7.

There has been described the importance of monitoring two important parameters of a large scale battery, both under charge and under discharge conditions. They are, of course, the electrochemical potential—the resistance free voltage—of the individual modules of the battery, and the resistive drop across each of the individual modules in a series connected battery as charging or discharge current flows through the battery. Clearly it is open to monitor and interpret as many levels of voltage drop, current, voltage differentials, and so on, as the sophistication and capital cost of the circuits may permit and as may be required in any given circumstance. Thus, the specific computations that may be made, the warnings and alarms that are generated, and the results thereby conveyed to the operator or driver of an electric vehicle, are not simply or specifically restricted to those described above. However, the discussions above indicate the manner in which circuits according to the present invention may be utilized for such purposes.

Finally, it has been noted that by monitoring the resistance free voltage of a module and the resistive drop across the module during discharge—for example, during the operation of an electric vehicle—important information concerning the state of charge of the battery is determined. Thus, the circuits provide means by which overdischarge of a battery may be precluded, thereby preventing serious damage to the battery. The number of modules present in the battery is not material to the present invention, and the discussions above are merely illustrative of the principles of the invention and not limiting thereto.

Obviously, even during discharge there must be short interruptions of that discharge current, in order that the resistance free voltage across any module may be determined. Thus, circuits in keeping with the present invention would be designed to integrate and work closely with the traction controller of an electric vehicle powered by a large scale battery, so that instantaneous interruptions of the discharge current flowing from a battery may occur under conditions where the operation of the vehicle is not affected. Since electric vehicles that are presently being tested, and electric vehicles as foreseen in the future, all have solid state controllers, there is no reason or concern that such monitoring cannot be effectively carried out. Still further, it can be noted that by monitoring the resistance free voltage of the battery modules, potentially damaging overcharge to the battery can be precluded during such vehicle operations as regenerative braking.

The scope of the present invention is defined by the appended claims.

What is claimed is:

1. A monitoring circuit for a battery while said battery is being charged or discharged, where said battery comprises a series of modules connected in series, and where a terminal is placed between each adjacent pair of modules and at each end of said battery, so that the voltage across each module may be measured at the pair of terminals defining the module, said monitoring circuit comprising:

means for periodically interrupting the flow of current to or from said battery for an interruption interval of fewer than about 2 to 10 ms;

means for selectively sampling the voltage of any one of said modules, during an interruption of current flow, so as to make a determination of the resistance free voltage of that module;

means for comparing said resistance free voltage of the module against at least two reference voltages, to determine if said resistance free voltage is above a first predetermined level or below a second predetermined level; and means for causing an alarm indication in the event that said resistance free voltage is found to be either above said first predetermined level or below said second predetermined level.

2. The monitoring circuit of claim 1, further comprising a time division multiplexer connected to said terminals, wherein sampling of the voltage of each of said modules is done seriatim by said time division multiplexer means, whereby at least some of said modules are sampled as to their resistance free voltage during any one interruption interval.

3. The monitoring circuit of claim 2, wherein a single difference amplifier having two inputs is utilized together with said time division multiplexer to determine the voltage across the inputs of said single difference amplifier as they are connected across the terminals of any one module by the operation of said time division multiplexer.

4. The monitoring circuit of claim 1, wherein sampling of the voltage of each of said modules is done by a dedicated amplifier assigned to each said module, and including means for selectively choosing any one of said dedicated amplifiers seriatim, whereby at least some of said modules are sampled as to their resistance free voltage during any one interruption interval.

5. The monitoring circuit of claim 1, further comprising means for sampling the voltage across any one of said modules while current is flowing through said module;

sample and hold means for determining and temporarily holding the values of a first voltage across the module being sampled when current is flowing through said module, and of a second resistance free voltage across the module during an interruption interval of current through said module;

means for determining the difference between said first and second voltages during charge and discharge conditions, and for determining if the difference between said first and second voltages during charging and discharging operations of said battery exceeds a predetermined value; and means for causing an alarm indication in the event that either of said first and second voltages is above or below predetermined values, or in the event that the difference between said first and second voltages exceeds said predetermined value.

6. The monitoring circuit of claim 1, wherein means are provided for monitoring a selected plurality of modules during any single interruption interval.

7. The monitoring circuit of claim 1, where only two reference voltages are referred to, and each of said two reference voltages is a function of a control reference voltage which is determined as a function of the battery voltage during a charging operation of said battery so as to thereby control the value of charging current delivered to said battery.

8. The monitoring circuit of claim 1, where the interruption interval is about 2 to 10 ms, and occurs at a frequency of about 0.5 to 25 Hz.

9. The monitoring circuit of claim 5, where the interruption interval is about 2 to 10 ms, and occurs at a frequency of about 0.5 to 25 Hz.

10. The monitoring circuit of claim 1, where the interruption interval is about 2 to 10 ms, and occurs at a frequency of about 1 to 10 Hz.

11. The monitoring circuit of claim 5, where the interruption interval is about 2 to 10 ms, and occurs at a frequency of about 1 to 10 Hz.

* * * * *